United States Patent
Gu et al.

(10) Patent No.: US 11,611,041 B2
(45) Date of Patent: Mar. 21, 2023

(54) ORGANIC THIN FILM HAVING ISOMERIZATION GENERATING LAYER AND METHOD FOR PREPARING THE SAME, DISPLAY DEVICE AND OPTICAL DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Xun Gu, Beijing (CN); Wenjuan Mei, Beijing (CN); Dan Liu, Beijing (CN); Baochao Li, Beijing (CN); Changjun Zhang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 296 days.

(21) Appl. No.: 16/957,269

(22) PCT Filed: Dec. 26, 2019

(86) PCT No.: PCT/CN2019/128536
§ 371 (c)(1),
(2) Date: Jun. 23, 2020

(87) PCT Pub. No.: WO2020/151450
PCT Pub. Date: Jul. 30, 2020

(65) Prior Publication Data
US 2021/0217954 A1    Jul. 15, 2021

(30) Foreign Application Priority Data
Jan. 22, 2019    (CN) .......................... 201910058660.8

(51) Int. Cl.
*H01L 27/32* (2006.01)
*H01L 51/56* (2006.01)
(Continued)

(52) U.S. Cl.
CPC ...... *H01L 51/0005* (2013.01); *H01L 27/3274* (2013.01); *H01L 51/5275* (2013.01); *H01L 51/56* (2013.01)

(58) Field of Classification Search
CPC .......................... H01L 51/0005; H01L 51/56
See application file for complete search history.

(56) References Cited

U.S. PATENT DOCUMENTS

| 6,326,640 B1 | 12/2001 | Shi et al. |
| 7,183,423 B1 * | 2/2007 | Ishii .......................... C07C 2/76 |
| | | 549/313 |

(Continued)

FOREIGN PATENT DOCUMENTS

| CN | 1630950 A | 6/2005 |
| CN | 102157707 A | 8/2011 |

(Continued)

OTHER PUBLICATIONS

First Office Action for Chinese Application No. 201910058660.8, dated Mar. 3, 2020, 6 Pages.
(Continued)

*Primary Examiner* — Caleb E Henry
(74) *Attorney, Agent, or Firm* — Brooks Kushman P.C.

(57) ABSTRACT

The present disclosure provides an organic thin film and a method for preparing the same, a display device, and an optical device, in which the method includes: providing a base substrate; forming an isomerization generating layer on the base substrate, the isomerization generating layer including a first region and a second region; adding a precursor solution on a surface of the isomerization generating layer
(Continued)

away from the base substrate, and allowing surface energy of the second region to be greater than surface energy of the first region, so as to form the organic thin film from the precursor solution, the precursor solution being at least partially located in the second region.

19 Claims, 7 Drawing Sheets

(51) Int. Cl.
   *H01L 51/00* (2006.01)
   *H01L 51/52* (2006.01)

(56) References Cited

U.S. PATENT DOCUMENTS

| | | | | |
|---|---|---|---|---|
| 8,049,413 | B2* | 11/2011 | Kumagai | H01L 51/56 313/504 |
| 2004/0201048 | A1* | 10/2004 | Seki | H05B 33/10 438/70 |
| 2005/0145839 | A1 | 7/2005 | Yamamoto et al. | |
| 2005/0196969 | A1* | 9/2005 | Gunner | H01L 51/0005 438/689 |
| 2008/0241429 | A1* | 10/2008 | Chen | G02F 1/133516 430/7 |
| 2008/0261160 | A1* | 10/2008 | Wang | G03F 7/0007 430/324 |
| 2009/0011142 | A1* | 1/2009 | Chen | H01L 27/3283 427/553 |
| 2009/0168144 | A1* | 7/2009 | Lo | G02B 26/005 359/290 |
| 2009/0321752 | A1* | 12/2009 | Zheng | H01L 51/0005 257/E33.074 |
| 2010/0193817 | A1* | 8/2010 | Amamiya | H01L 51/56 257/98 |
| 2010/0252955 | A1* | 10/2010 | Agarwal | C09D 153/02 264/293 |
| 2011/0127507 | A1 | 6/2011 | Choi et al. | |
| 2011/0180821 | A1* | 7/2011 | Matsushima | H01L 27/3246 438/34 |
| 2011/0198623 | A1* | 8/2011 | Matsushima | H01L 27/3246 438/34 |
| 2011/0198624 | A1* | 8/2011 | Matsushima | H01L 27/3246 438/34 |
| 2012/0091440 | A1* | 4/2012 | Matsushima | H01L 27/3211 438/35 |
| 2012/0091441 | A1* | 4/2012 | Matsushima | H01L 27/3246 438/35 |
| 2012/0091483 | A1* | 4/2012 | Matsushima | H01L 27/3246 257/89 |
| 2012/0217518 | A1* | 8/2012 | Abe | H01L 51/5209 438/34 |
| 2013/0105781 | A1* | 5/2013 | Matsushima | H01L 51/5203 438/46 |
| 2013/0126847 | A1* | 5/2013 | Harada | H01L 27/3246 438/22 |
| 2013/0126848 | A1* | 5/2013 | Harada | H01L 51/5088 438/46 |
| 2013/0248825 | A1 | 9/2013 | Sugizaki et al. | |
| 2019/0148468 | A1* | 5/2019 | Jia | H01L 27/3283 257/40 |
| 2019/0181195 | A1* | 6/2019 | Wang | H01L 27/3246 |
| 2019/0181203 | A1* | 6/2019 | Tan | H01L 27/3246 |
| 2019/0189713 | A1* | 6/2019 | Kondo | H01L 51/5221 |
| 2020/0312929 | A1* | 10/2020 | Kishimoto | H01L 51/5012 |

FOREIGN PATENT DOCUMENTS

| | | |
|---|---|---|
| CN | 103325954 A | 9/2013 |
| CN | 104744648 A | 7/2015 |
| CN | 106356453 A | 1/2017 |
| CN | 107629379 A | 1/2018 |
| CN | 108484825 A | 9/2018 |
| CN | 109786552 A | 5/2019 |

OTHER PUBLICATIONS

International Search Report and Written Opinion for Application No. PCT/CN2019/128536, dated Mar. 26, 2020, 11 Pages.

* cited by examiner

ORGANIC THIN FILM HAVING ISOMERIZATION GENERATING LAYER AND METHOD FOR PREPARING THE SAME, DISPLAY DEVICE AND OPTICAL DEVICE

CROSS-REFERENCE TO RELATED APPLICATION APPLICATIONS

This application is the U.S. national phase of PCT Application No. PCT/CN2019/128536 filed on Dec. 26, 2019, which claims priority to Chinese Patent Application No. 201910058660.8 filed on Jan. 22, 2019, which are incorporated herein by reference in their entireties.

TECHNICAL FIELD

The present disclosure relates to the field of display technology, in particular to an organic thin film and a method for preparing the same, a display device and an optical device.

BACKGROUND

Inkjet printing technology can accurately control the volume of the sprayed solution on the base substrate, and thus print out different patterned functional thin films and apply them to electronic devices. Due to the characteristics of high efficiency, low cost, non-contact and flexible processing, inkjet printing technology has been gradually applied to the processing of organic light-emitting diodes, organic thin film transistors, microlenses and other devices.

In the related art, the spread of inkjet printed ink on the substrate material and the pinning behavior of the contact lines have a certain randomness, resulting in different shapes of the produced organic thin films, and low production yield of organic thin films.

SUMMARY

In a first aspect, an embodiment of the present disclosure provides a method for preparing an organic thin film, the method including: providing a base substrate; forming an isomerization generating layer on the base substrate, the isomerization generating layer including a first region and a second region; and adding a precursor solution on a surface of the isomerization generating layer away from the base substrate, and allowing surface energy of the second region to be greater than surface energy of the first region, so as to form the organic thin film with the precursor solution, the precursor solution being at least partially located in the second region.

Further, a first portion of the organic thin film is located in the first region, and a second portion of the organic thin film is located in the second region.

Further, the isomerization generating layer is a photosensitive layer with a reversible isomerization reaction.

The adding the precursor solution on the surface of the isomerization generating layer away from the base substrate, and allowing the surface energy of the second region to be greater than the surface energy of the first region, so as to form the organic thin film with the precursor solution includes: inkjet printing the precursor solution on a surface of the photosensitive layer away from the base substrate; and irradiating the second region provided with the precursor solution with light of a preset wavelength range corresponding to the photosensitive layer, so as to allow surface energy of the second region to be greater than surface energy of the first region to form the organic thin film aligned from the first portion to the second portion with the precursor solution.

Further, the isomerization generating layer is a photosensitive layer with an irreversible isomerization reaction.

The adding the precursor solution on the surface of the isomerization generating layer away from the base substrate, and allowing the surface energy of the second region to be greater than the surface energy of the first region, so as to form the organic thin film with the precursor solution includes: irradiating the second region with light of a predetermined wavelength range corresponding to the photosensitive layer, so as to allow surface energy of the second region to be greater than surface energy of the first region; and inkjet printing a precursor solution on a surface of the photosensitive layer irradiated away from the base substrate, so as to form the organic thin film aligned from the first portion to the second portion with the precursor solution.

Further, the organic thin film is located in the second region.

Further, the isomerization generating layer is a photosensitive layer with a reversible isomerization reaction, and the second region has a preset shape.

The adding the precursor solution on the surface of the isomerization generating layer away from the base substrate, and allowing the surface energy of the second region to be greater than the surface energy of the first region, so as to form the organic thin film with the precursor solution includes: inkjet printing the precursor solution on a surface of the second region away from the base substrate; and irradiating the second region provided with the precursor solution with light of a preset wavelength range corresponding to the photosensitive layer, so as to allow the surface energy of the second region to be greater than the surface energy of the first region, to form the organic thin film having the preset shape with the precursor solution.

Further, the isomerization generating layer is a photosensitive layer with an irreversible isomerization reaction, and the second region has a preset shape.

The adding the precursor solution on the surface of the isomerization generating layer away from the base substrate, and allowing the surface energy of the second region to be greater than the surface energy of the first region, so as to form the organic thin film with the precursor solution includes: irradiating the second region with light of a predetermined wavelength range corresponding to the photosensitive layer, so as to allow the surface energy of the second region to be greater than the surface energy of the first region; and inkjet printing the precursor solution on a surface of the second region irradiated away from the base substrate, so as to form the organic thin film having the preset shape with the precursor solution.

Further, the second region is circular.

The forming the organic thin film covering the second region includes: forming an organic thin film with curved surface having the preset shape, a curvature of the curved surface of the organic thin film being inversely proportional to a diameter of the second region.

In a second aspect, an embodiment of the present disclosure further provides an organic thin film prepared by the method for preparing an organic thin film as described above.

In a third aspect, an embodiment of the present disclosure also provides a display device including the organic thin film as described above.

According to a fourth aspect, an embodiment of the present disclosure also provides an optical device including the organic thin film as described above.

BRIEF DESCRIPTION OF THE DRAWINGS

In order to illustrate the technical solutions of the present disclosure in a clearer manner, the drawings desired for the embodiments of the present disclosure will be described briefly hereinafter. Obviously, the following drawings merely relate to some embodiments of the present disclosure. Based on these drawings, a person skilled in the art may obtain the other drawings without any creative effort.

DETAILED DESCRIPTION

The technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

Embodiments of the present disclosure provide an organic thin film and a method for preparing the same, a display device, and an optical device, which is capable of solving the problem of low production yield of organic thin film in the related art.

Figure 1:
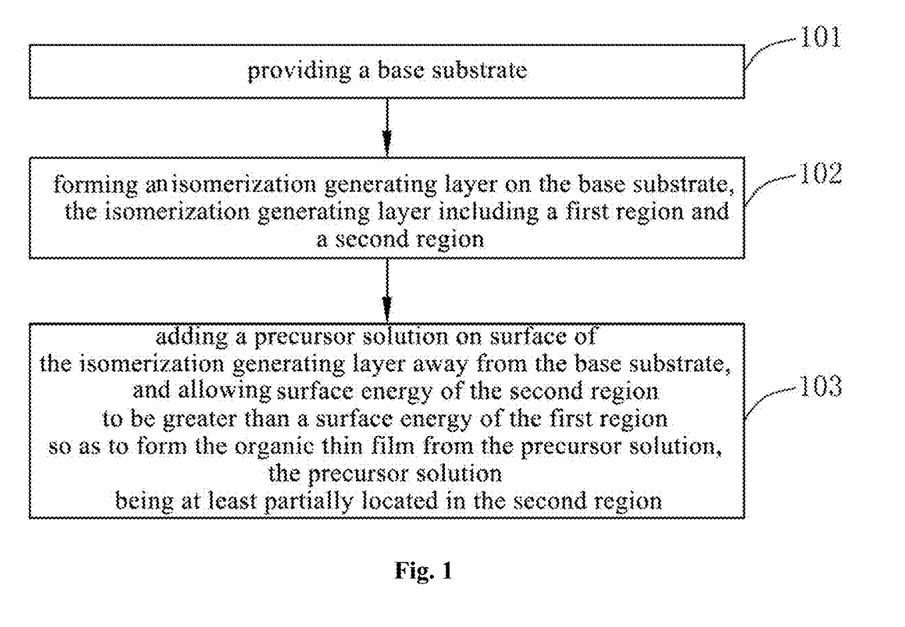
FIG. 1 is a schematic view showing the flowchart of the method for preparing an organic thin film according to an embodiment of the present disclosure.

An embodiment of the present disclosure provides a method for preparing an organic thin film, as shown in FIG. 1, including:

step 101: providing a base substrate;

step 102: forming an isomerization generating layer on the base substrate, the isomerization generating layer including a first region and a second region; and step 103: adding a precursor solution on a surface of the isomerization generating layer away from the base substrate, and allowing surface energy of the second region to be greater than surface energy of the first region so as to form the organic thin film from the precursor solution, the precursor solution being at least partially located in the second region.

In an embodiment of the present disclosure, the isomerization reaction occurs in the second region in the isomerization generating layer, so that the surface energy of the second region is greater than the surface energy of the first region, the characteristics that the precursor solution is more likely to pin the second region having a larger surface energy is capable of ensuring that the shape of the prepared organic thin film meets the production requirements, and improving the production yield of the organic thin film. Therefore, the technical solution provided by the present disclosure is capable of improving the yield of the organic thin film.

The above base substrate may be a flexible substrate, such as a polyimide film; or may be a rigid base substrate, such as a quartz substrate or a glass substrate.

The isomerization generating layer may be formed on the base substrate by means of deposition, specifically using physical deposition or chemical deposition, which is not limited in the embodiments of the present disclosure. The isomerization generating layer can undergo an isomerization reaction, and be used to increase surface energy under triggering conditions.

The manner in which the precursor solution is added to the isomerization generating layer may be deposition, printing, coating, etc., and the embodiments of the present disclosure do not limit the specific manner of adding the precursor solution.

The precursor solution is the existing form before the organic thin film is formed. When making different organic thin films, the composition, proportion and size of the precursor solution may be different, and the precursor solution may be determined according to actual needs. The precursor solution in the embodiments of the present disclosure can cover local regions of the isomerization generating layer, and the precursor solution can be added to a plurality of regions on the isomerization generating layer to form a plurality of organic thin films.

In the embodiments of the present disclosure, the time sequence between the occurrence time of isomerization reaction and the addition time of the precursor solution is related to whether the isomerization reaction of the isomerization generating layer is reversible. In the case where the isomerization reaction is reversible, the precursor solution may be added before the isomerization reaction; and in the case where the isomerization reaction is irreversible, the precursor solution is added after the isomerization reaction.

In the embodiment of the present disclosure, the isomerization reaction may occur in only the second region in the isomerization generating layer, so that the surface energy of the second region is greater than the surface energy of the first region; or both the first region and the second region may occur isomerization reaction, but the degree of isomerization reaction in the second region is greater, so that the surface energy of the second region is greater than the surface energy of the first region; or after the same degree of isomerization occurs in the first region and in the second region, the first region reversibly reduce the surface energy, so that the surface energy of the second region is greater than the surface energy of the first region.

The precursor solution will be easier to be pinned in the area with large surface energy. When the precursor solution is all in the second region, the precursor solution will be pinned in the second region with large surface energy instead of being pinned in the first region, thereby ensuring that the precursor solution will only flow in the second region and not flow into the first region, and further ensuring the location of the formed organic thin film; when a part of the precursor solution is located in the first region and another part is located in the second region, the contact angle of the precursor solution in the second region (due to more pinning) with the second region will be smaller than the contact angle of the precursor solution with the first region, so that the solution located in the first region moves to the second region, thereby forming a fixed, and aligned organic thin film.

In some optional embodiments, a first portion of the organic thin film is located in the first region, and a second portion is located in the second region.

In the related art, the spread of the inkjet printed ink on the substrate material and the pinning behavior of its contact lines have a certain randomness, so that there are different lattice or molecular orientations between crystal domains of organic semiconductor thin film for inkjet printing, and the crystal morphology of the organic thin films prepared in this way are different, resulting in uneven performance of each organic thin film, and low performance stability of the organic thin film.

In this embodiment, when adding the precursor solution, a part of the precursor solution is added to the first region and another part of the precursor solution is added to the second region, so that the first part of the finally formed organic thin film is located in the first region, and the second part is located in the second region.

In the process of forming the organic thin film of the precursor solution, the precursor solution is easier to be pinned in the second region, resulting in the contact angle of the precursor solution in the second region being smaller than the contact angle in the first region. The precursor solution on the side having larger contact angle moves to the side having smaller contact angle. As the precursor solution evaporates and deposits during the movement, an organic thin film aligned from the first part to the second part is formed. Therefore, by designing the shape and position of the second region in the isomerization generating layer, an organic thin film with a predetermined orientation can be prepared, thereby ensuring that the prepared organic thin film has the same orientation and crystalline morphology, so that the organic thin film has the same performance, and improves the stability of the performance of the prepared organic thin film.

Further, the isomerization generating layer is a photosensitive layer with a reversible isomerization reaction.

The adding the precursor solution on the surface of the isomerization generating layer away from the base substrate, and allowing the surface energy of the second region to be greater than the surface energy of the first region so as to form the organic thin film from the precursor solution includes: inkjet printing the precursor solution on a surface of the photosensitive layer away from the base substrate; and irradiating the second region provided with the precursor solution using light with a preset wavelength range corresponding to the photosensitive layer, so as to allow surface energy of the second region to be greater than surface energy of the first region to form the organic thin film aligned from the first portion to the second portion with the precursor solution.

In this embodiment, the isomerization generating layer is a photosensitive layer. The photosensitive layer is made of a photosensitive material containing a hydrophobic side chain group with light response. The triggering condition for the isomerization reaction of the photosensitive layer is that it is subject to an irradiation of light with a preset wavelength range corresponding to the photosensitive layer. Different photosensitive layers have different wavelength ranges of light in triggering conditions. For example, when the photosensitive layer is a fluorine-containing azobenzene polymer material, the light corresponding to the isomerization reaction is ultraviolet light within a certain range.

Figure 2A:
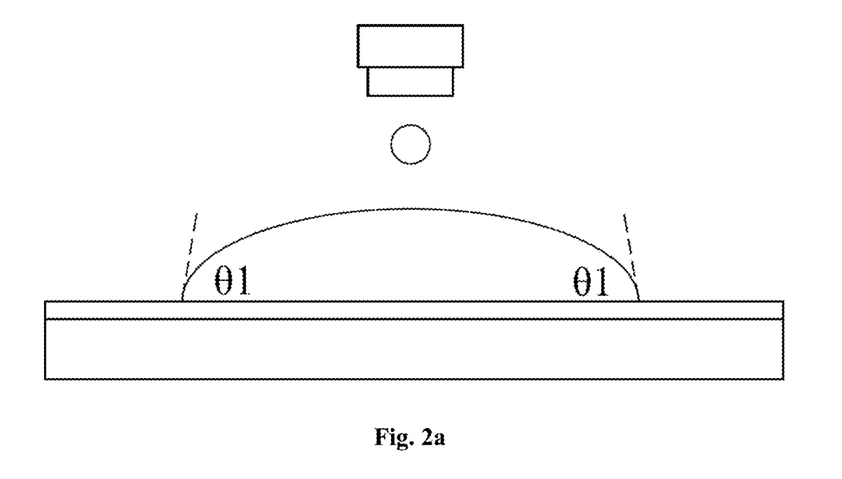
FIG. 2a is a structural schematic view showing adding a precursor solution in the method for preparing an organic thin film according to an embodiment of the present disclosure.

First, the precursor solution is inkjet printed on the side of the photosensitive layer away from the base substrate, as shown in FIG. 2a. At this time, the isomerization generating layer has not undergone the isomerization reaction, and the contact angles between the precursor solution and the isomerization generating layer are all θ1.

Figure 2B:
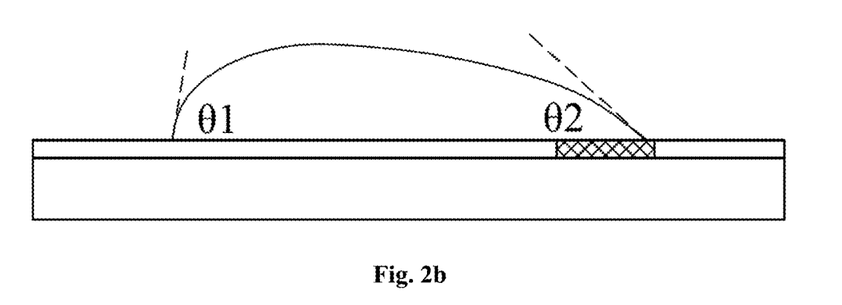
FIG. 2b is a structural schematic view showing a precursor solution after an isomerization reaction occurs in the method for preparing an organic thin film according to an embodiment of the present disclosure.

After that, the light with the preset wavelength range corresponding to the photosensitive layer is irradiated on the second region, as shown in FIG. 2b. At this time, the photosensitive material in the second region undergoes an isomerization reaction due to light irradiation, the hydrophobic group in the side chain shrinks, the surface energy of the second region increases, and the precursor solution is more likely to be pinned in the second region, resulting in the contact angle of the precursor solution in the second region decreasing to θ2.

Figure 2C:
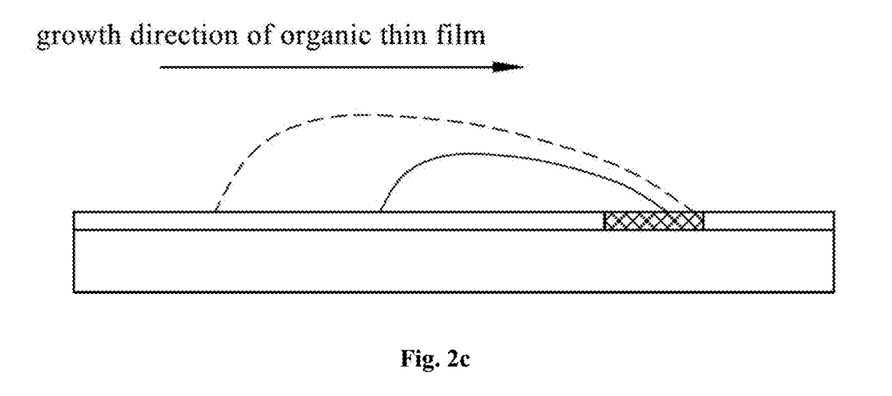
FIG. 2c is a structural schematic view showing an aligned organic thin film formed in the method for preparing an organic thin film according to an embodiment of the present disclosure.

Finally, the precursor solution on the side having larger contact angle moves to the side having smaller contact angle. As the precursor solution evaporates and deposits during the movement, an organic thin film with aligned crystals is formed. The orientation direction of aligned crystal is a direction from the first part to the second part, as shown in FIG. 2c, in which the dotted line in the figure is the outline of the precursor solution before forming the organic thin film, and the solid line is the outline of the organic thin film after forming the organic thin film.

In this way, an organic thin film aligned from the first portion to the second portion can be obtained. In the preparing process of each organic thin film, by ensuring the position of the second region irradiated by light, the prepared organic thin film can have the same orientation, so that the organic thin films all have the same performance, thereby improving the stability of the performance of the prepared organic thin films.

Further, the isomerization generating layer is a photosensitive layer with an irreversible isomerization reaction.

The adding the precursor solution on the surface of the isomerization generating layer away from the base substrate, and allowing the surface energy of the second region to be greater than the surface energy of the first region, so as to form the organic thin film from the precursor solution includes: irradiating the second region with light of a predetermined wavelength range corresponding to the photosensitive layer, so as to allow surface energy of the second region to be greater than surface energy of the first region; and inkjet printing a precursor solution on a surface of the photosensitive layer irradiated away from the base substrate, so as to form the organic thin film aligned from the first portion to the second portion with the precursor solution.

The photosensitive material in this embodiment may be a fluorine-containing azobenzene trithiocarbonate material.

Figure 3A:
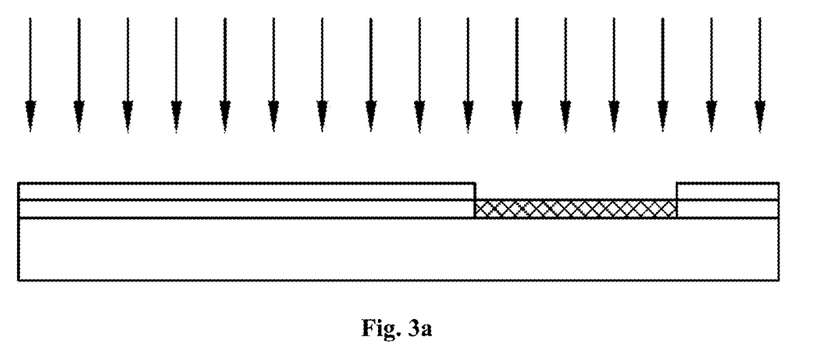
FIG. 3a is a structural schematic view showing the triggering an isomerization reaction in a second region in a method for producing an organic thin film according to an embodiment of the present disclosure.

First, the second region is irradiated with light of a predetermined wavelength range, so that an isomerization reaction occurs in the second region, that is, the surface energy of the second region is greater than the surface energy of the first region. The specific irradiation method may be to align the second region with a collimated light source for irradiation, or to cover the first region with a mask plate to expose the second region, followed by irradiating the entire isomerization generating layer with the light source (as shown in FIG. 3a).

Figure 3B:
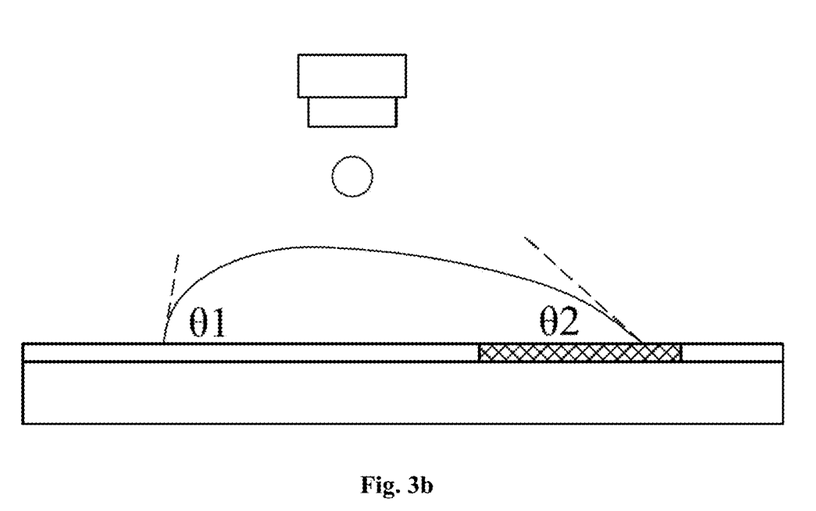
FIG. 3b is a structural schematic view showing adding a precursor solution in a method for preparing an organic thin film according to an embodiment of the present disclosure.

After the irradiating is completed, the surface energy of the second region increases and cannot be recovered. Then, the precursor solution in the first region and the second region is added to the isomerization generating layer, and the precursor solution in contact with the isomerization generating layer is more likely to be pinned in the second region, resulting in the contact angle θ2 of the precursor solution in the second region being smaller than the contact angle θ1 of the precursor solution in the first region, as shown in FIG. 3b.

Figure 3C:
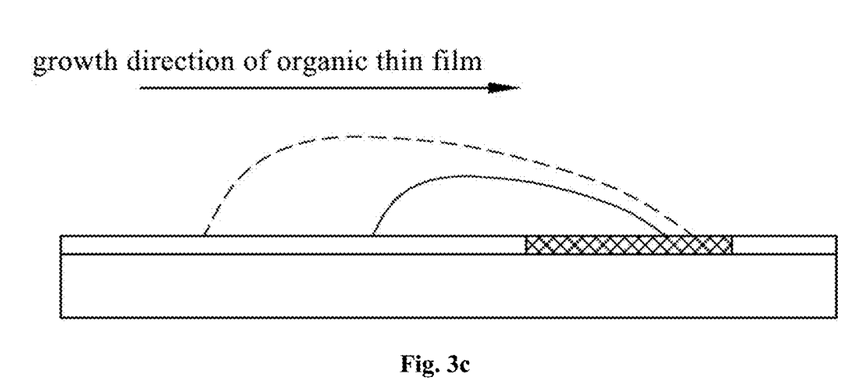
FIG. 3c is a structural schematic view showing an aligned organic thin film formed in the method for preparing an organic thin film according to an embodiment of the present disclosure.

Finally, the precursor solution on the side having larger contact angle moves to the side having smaller contact angle. As the precursor solution evaporates and deposits during the movement, an organic thin film with aligned crystals is formed. The orientation direction of aligned crystal is a direction from the first part to the second part, as shown in FIG. 3c, in which the dotted line in the figure is the outline of the precursor solution before forming an organic thin film, and the solid line is the outline of the organic thin film after forming the organic thin film.

In this way, an organic thin film aligned from the first portion to the second portion can be obtained. In the preparing process of each organic thin film, by ensuring the position of the second region irradiated by light, the prepared organic thin film can have the same orientation, so that the organic thin films all have the same performance, thereby improving the stability of the performance of the prepared organic thin films.

Figure 4:
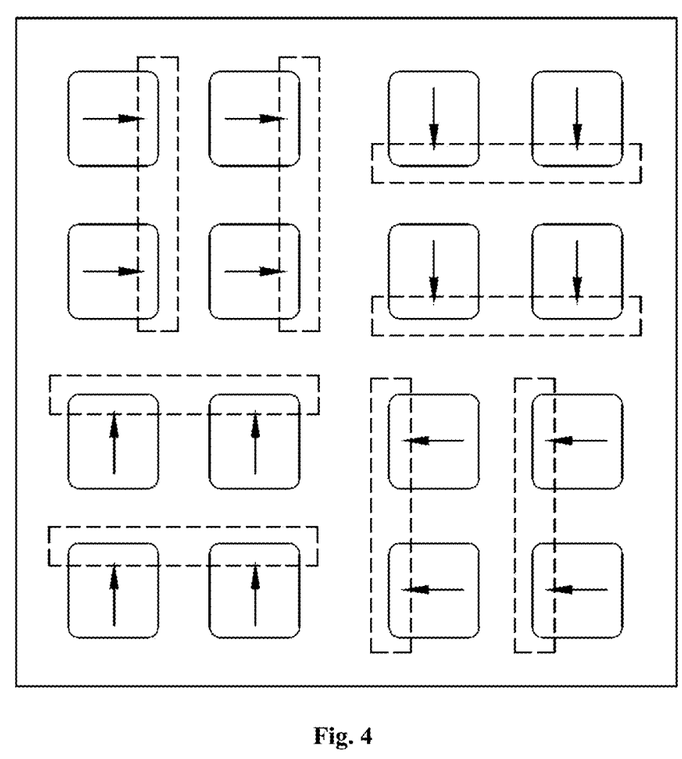
FIG. 4 is a structural schematic view showing an organic thin film with multiple orientations formed on the same isomerization generating layer in the method for preparing an organic thin film according to an embodiment of the present disclosure.

It should be noted that, through coordination between the position of the precursor solution and the position of the second region, organic thin films with different orientation directions can be formed on the same layer of the isomerization generation layer, as shown in FIG. 4.

When the precursor solution is 6,13-bis (triisopropylsilylethynyl)pentacene and other organic semiconductor solution, organic semiconductor films can be produced, and the characteristics that organic semiconductor films with the same crystal orientation allow each device to achieve high performance consistency can be applied to the field of large-size liquid crystal display and organic electro-laser display drive, and ultra-sensitive array sensor.

Specifically, since the direction of the active layer corresponds to the direction of the polarized light, the light field sensor is composed of thin film transistors made of active layers in different directions, so that the organic semiconductor thin film array having the corresponding crystal orientation prepared by the above method can adjust the channel direction corresponding to the organic thin film transistor array to meet adaptation requirements of 2D and 3D light field sensors for the polarized light in all directions, and the crystal orientation can be designed according to actual needs. In addition, according to the circuit layout requirements, only the orientation of the active layer can be adjusted to realize the differential arrangement of the TFT array in the display area and the non-display area, such as a shift register and a driving circuit that implement different functions.

In other optional embodiments, the organic thin film is located in the second region.

In the related art, the spread of the inkjet printing ink on the substrate material and the pinning behavior of the contact lines have a certain randomness, so that the precursor solution of the inkjet printing will flow, and the shapes and positions of the organic thin films prepared in this way are different. Some of the organic thin films may not meet the production requirements, thereby reducing the production yield of organic thin films.

In this embodiment, the organic thin film is formed in the second region by adding all the precursor solutions to the second region. Since the surface energy of the second region is greater than that of the first region during the formation of the organic thin film, all the precursor solution is pinned in the second region and will not flow to the first region, thereby being capable of defining the formation position and shape of the organic thin film and improving the production yield of the organic thin film.

Further, the isomerization generating layer is a photosensitive layer with a reversible isomerization reaction, and the second region has a preset shape.

The adding the precursor solution on the surface of the isomerization generating layer away from the base substrate, and allowing the surface energy of the second region to be greater than the surface energy of the first region, so as to form the organic thin film from the precursor solution includes: inkjet printing the precursor solution on a surface of the second region away from the base substrate; and irradiating the second region provided with the precursor solution with light of a preset wavelength range corresponding to the photosensitive layer, so as to allow surface energy of the second region to be greater than surface energy of the first region to form the organic thin film having the preset shape with the precursor solution.

In this embodiment, the isomerization generating layer is a photosensitive layer. The triggering condition for the isomerization reaction of the photosensitive layer is that it is subject to an irradiation of light within a preset wavelength range corresponding to the photosensitive layer. Different photosensitive layers have different wavelength ranges of light in triggering conditions. For example, when the photosensitive layer is a fluorine-containing azobenzene polymer material, the corresponding light is ultraviolet light within a certain range.

First, the precursor solution is inkjet printed on the second region of a surface of the photosensitive layer away from the base substrate, and the precursor solution covers the second region.

After that, the light with the preset wavelength range corresponding to the photosensitive layer is irradiated on the second region. At the same time, an isomerization reaction occurs in the second region, the surface energy of the second region increases, and the precursor solution is easier to be pinned in the second region, resulting in the precursor solution not moving to the first region during the formation of the organic thin film. It should be noted that the shape of the second region may be any shape, such as a cross shape, a triangle shape, a circle shape, an oval shape, etc., and it can be designed according to the application of the organic thin film.

Finally, the precursor solution in the second region forms an organic thin film having the same shape as the second region and having a certain thickness.

In this way, the thin film with desired shape can be made by designing the second region having the same shape, allowing the precursor solution to be pinned in the second region after the isomerization reaction, thereby being capable of achieving an organic thin film having the same shape as the second region. When organic thin films are used in the field of thin film transistors, the shape of the organic thin film can be designed differently according to the needs of the product, so that it has advantages of maximizing the integration of thin film transistors in limited substrate space, having a large scale, highly integrated circuit design. In addition, when the organic thin film is a fluorescent material, it can be adapted to the pentile (P) arrangement of OLED pixels or other arrangements with different pixel size combinations to improve the display effect of the display device.

Further, the isomerization generating layer is a photosensitive layer with an irreversible isomerization reaction, and the second region has a preset shape.

The adding the precursor solution on the surface of the isomerization generating layer away from the base substrate, and allowing the surface energy of the second region to be greater than the surface energy of the first region, so as to form the organic thin film from the precursor solution includes: irradiating the second region with light of a predetermined wavelength range corresponding to the photosensitive layer, so as to allow surface energy of the second region to be greater than surface energy of the first region; and inkjet printing a precursor solution on a surface of the second region irradiated away from the base substrate, so as to form the organic thin film having the preset shape with the precursor solution.

Figure 5:
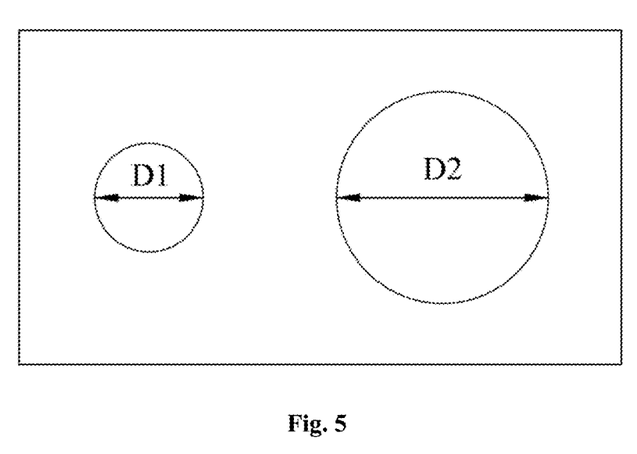
FIG. 5 is a schematic view showing the maximum width of the precursor solution on the isomerization generating layer before and after the isomerization reaction in the method for preparing an organic thin film according to an embodiment of the present disclosure.

The maximum width of the thin film of the precursor solution before the isomerization reaction is D1, and the maximum width of the thin film after the isomerization reaction is D2, in which D2>D1, as shown in FIG. 5. The maximum distance D between two points on the outline of the preset shape should be greater than D1 and less than D2.

Figure 6A:
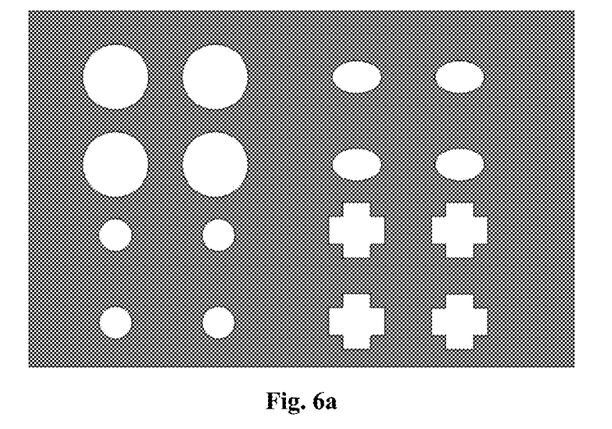
FIG. 6a is a structural schematic view showing a mask plate in a method for preparing an organic thin film according to an embodiment of the present disclosure.
Figure 6B:
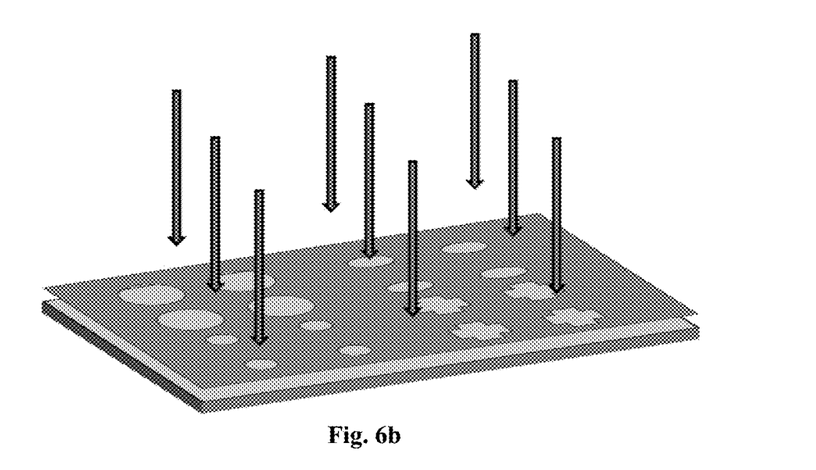
FIG. 6b is a structural schematic view showing the triggering an isomerization reaction in a second region in a method for producing an organic thin film according to an embodiment of the present disclosure.

First, the second region is irradiated with light of a predetermined wavelength range, so that an isomerization reaction occurs in the second region, that is, the surface energy of the second region is greater than the surface energy of the first region. The specific irradiation method may be to align the second region with a collimated light source for irradiation; or to design a via hole having a preset shape that penetrates the mask plate in advance (as shown in FIG. 6a, the second region having the corresponding shape is achieved by designing via holes having different shape, thereby achieving an organic thin film of the corresponding shape); then the mask plate is covered on the isomerization layer, the second region is exposed at the via hole, and then the entire isomerization generating layer is irradiated by the light source (as shown in FIG. 6b).

After the isomerization reaction is completed, the precursor solution is added to the isomerization generating layer and completely covers the second region. The precursor solution in contact with the isomerization generating layer is more likely to pin in the second region, resulting the precursor solution not moving to the first region during the formation of the organic thin film.

Figure 6C:
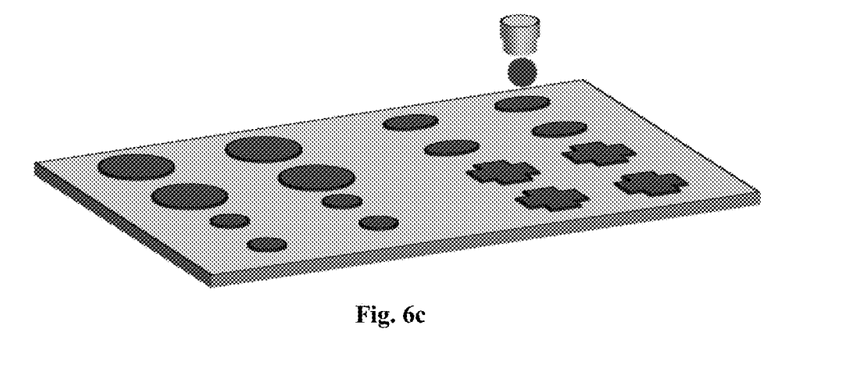
FIG. 6c is a structural schematic view showing an aligned organic thin film formed in the method for preparing an organic thin film according to an embodiment of the present disclosure.

Finally, the precursor solution in the second region forms an organic thin film having the same shape as the second region and a certain thickness, as shown in FIG. 6c. It can be seen that organic thin films having various shapes can be formed on the same isomerization layer.

In this way, the thin film with desired shape can be made by designing the second region having the same shape, allowing the precursor solution to be pinned in the second region after the isomerization reaction, thereby being capable of achieving an organic thin film having the same shape as the second region. When organic thin films are used in the field of thin film transistors, the shape of the organic thin film can be designed differently according to the needs of the product, so that it has advantages of maximizing the integration of thin film transistors in limited substrate space, having a large scale, highly integrated circuit design. In addition, when the organic thin film is a fluorescent material, it can be adapted to the pentile (P) arrangement of OLED pixels or other arrangements with different pixel size combinations to improve the display effect of the display device.

Further, the second region is circular.

The forming the organic thin film having the preset shape includes: forming the organic thin film with a curved surface covering the second region, a curvature of the curved surface of the organic thin film being inversely proportional to a diameter of the second region.

Figure 7A:
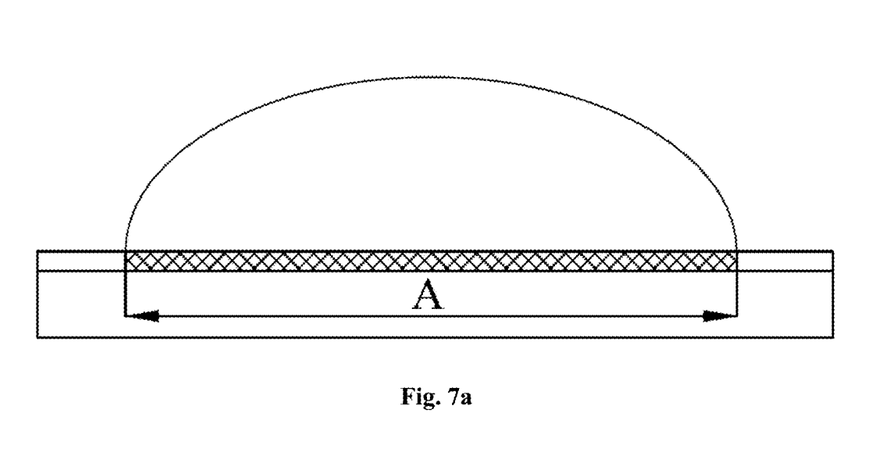
FIG. 7a is a schematic view showing the curvature of the arc surface when the diameter is A in the method for preparing an organic thin film according to an embodiment of the present disclosure.
Figure 7B:
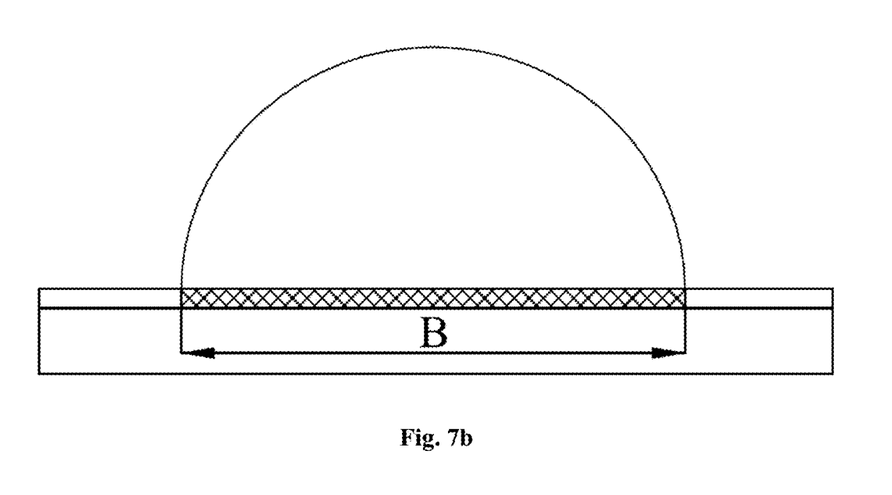
FIG. 7b is a schematic view showing the curvature of the arc surface when the diameter is B in the method for preparing an organic thin film according to an embodiment of the present disclosure.

The precursor solution is all located in the second region. Since the volume of the precursor solution is constant, the smaller the bottom area is, the higher the height of the precursor solution is, resulting in a greater curvature of the curved surface, as shown in FIGS. 7a and 7b. FIG. 7a is a cross-sectional view of the precursor solution when the diameter of the second region is A, and FIG. 7b is a cross-sectional view of the precursor solution when the diameter of the second region is B, where A is smaller than B. It can be seen that the curvature of the curved surface of the organic thin film in FIG. 7b is greater than the curvature of the curved surface of the organic thin film in FIG. 7a. If the curvature of the curved surface is r1 when the diameter of the bottom surface is D1 and the curvature of the curved surface is r2 when the diameter of the bottom surface is D2, an organic thin film with a curvature of the curved surface being r can be produced, where $r1 \leq r \leq r2$.

Taking the isomerization generating layer as the photosensitive layer with an irreversible isomerization reaction as an example, the process of forming the organic thin film will be explained:

The maximum width of the thin film of the precursor solution before the isomerization reaction is D1, and the maximum width of the thin film after the isomerization reaction is D2, in which D2>D1, as shown in FIG. 5. The maximum distance D between two points on the outline of the preset shape should be greater than D1 and less than D2.

Figure 8A:
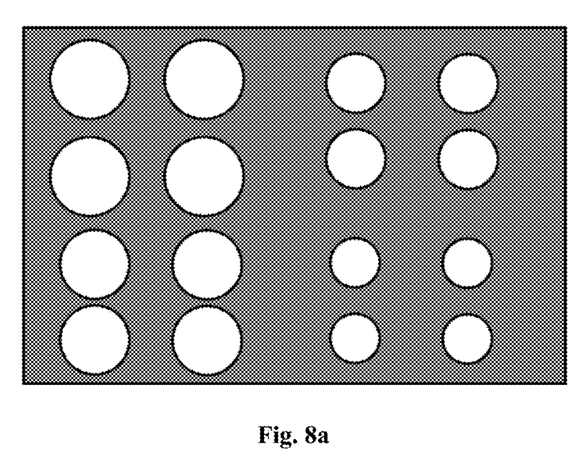
FIG. 8a is a structural schematic view showing a mask plate in a method for preparing an organic thin film according to an embodiment of the present disclosure.
Figure 8B:
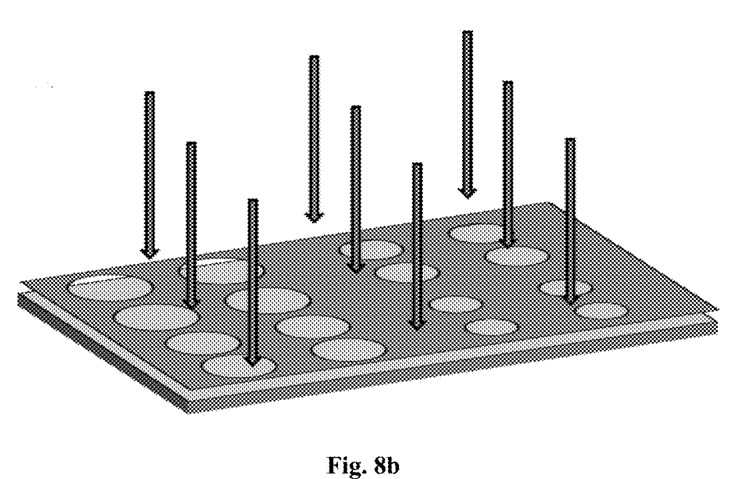
FIG. 8b is a structural schematic view showing the triggering an isomerization reaction in a second region in the method for preparing an organic thin film according to an embodiment of the present disclosure.

First, the second region is irradiated with light of a predetermined wavelength range, so that an isomerization reaction occurs in the second region, that is, the surface energy of the second region is greater than the surface energy of the first region. The specific irradiation method may be to align the second region with a collimated light source for irradiation; or to design a via hole having a preset shape that penetrates the mask plate in advance (as shown in FIG. 8*a*, the second region having the corresponding shape is achieved by designing via holes having different shape, thereby achieving an organic thin film having the corresponding shape); then the mask plate is covered on the isomerization layer, the second region is exposed at the via hole, and then the entire isomerization layer is irradiated with the light source (as shown in FIG. 8*b*).

After the isomerization reaction is completed, the precursor solution is added to the isomerization generating layer and completely covers the second region. The precursor solution in contact with the isomerization generating layer is more likely to pin in the second region, resulting the precursor solution not moving to the first region during the formation of the organic thin film.

Figure 8C:
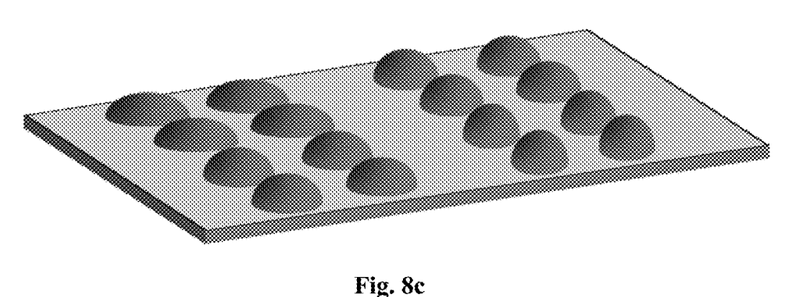
FIG. 8c is a structural schematic view showing the forming an aligned curved organic thin film formed in the method for preparing an organic thin film according to an embodiment of the present disclosure.

Finally, the precursor solution in the second region forms an organic thin film with curved surface having the same shape and a certain curvature as the second region. As shown in FIG. 8*c*, it can be seen that the organic thin films with curved surface having a variety of curvature can be formed on the same layer as isomerization generating layer.

In this way, an organic thin film with curved surface can be prepared by using the organic thin film can be used as a microlens. In this case, the organic thin film is a microlens colloidal solution, such as a transparent material or a fluorescent material, so as to produce lenses with different curvatures.

In the technical solution provided by the present disclosure, the isomerization reaction occurs in the second region in the isomerization generating layer, so that the surface energy of the second region is greater than the surface energy of the first region, the characteristics that the precursor solution is more likely to pin the second region having a larger surface energy is capable of ensuring that the shape of the prepared organic thin film meets the production requirements, and improving the production yield of the organic thin film. Therefore, the technical solution provided by the present disclosure is capable of improving the yield of the organic thin film.

An embodiment of the present disclosure also provides an organic thin film produced by the above-mentioned method for producing an organic thin film.

In the organic thin film of an embodiment of the present disclosure, the isomerization reaction occurs in the second region in the isomerization generating layer, so that the surface energy of the second region is greater than the surface energy of the first region, the characteristics that the precursor solution is more likely to pin the second region having a larger surface energy is capable of ensuring that the prepared organic thin film has stable performance.

An embodiment of the present disclosure also provides a display device including the organic thin film as described above.

The display device may be a displayer, a mobile phone, a tablet computer, a television, a wearable electronic device, a navigation display device, or the like.

An embodiment of the present disclosure also provides an optical device including the organic thin film as described above.

The organic thin film can affect the propagation of light by the optical lens in the optical device, thereby achieving the optical effect of the optical device.

Unless otherwise defined, technical terms or scientific terms used herein have the normal meaning commonly understood by one skilled in the art in the field of the present disclosure. The words "first", "second", and the like used herein do not denote any order, quantity, or importance, but rather merely serve to distinguish different components. The "including", "comprising", and the like used in the present disclosure means that the element or item appeared in front of the word encompasses the element or item and their equivalents listed after the word, and does not exclude other elements or items. The words "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The embodiments of the present disclosure have been described above with reference to the accompanying drawings, but the present disclosure is not limited to the above specific embodiments, and the above specific embodiments are merely illustrative, and not limited. Without departing from the scope of the present disclosure and the protection scope of the claims, a person skilled in the art can made many variations in light of the present disclosure, all of which fall into the protection of the present disclosure.

What is claimed is:

1. A method for preparing an organic thin film, the method comprising:
   providing a base substrate;
   forming an isomerization generating layer on the base substrate, the isomerization generating layer comprising a first region and a second region; and
   adding a precursor solution on a surface of the isomerization generating layer away from the base substrate, and allowing surface energy of the second region to be greater than surface energy of the first region, so as to form the organic thin film with the precursor solution, the precursor solution being at least partially located in the second region,
   wherein the isomerization generating layer is a photosensitive layer with a reversible isomerization reaction; and
   the adding the precursor solution on the surface of the isomerization generating layer away from the base substrate, and allowing the surface energy of the second region to be greater than the surface energy of the first region, so as to form the organic thin film with the precursor solution comprises:

inkjet printing the precursor solution on a surface of the photosensitive layer away from the base substrate; and irradiating the second region provided with the precursor solution with light of a preset wavelength range corresponding to the photosensitive layer, so as to allow the surface energy of the second region to be greater than the surface energy of the first region to form the organic thin film aligned from the first portion to the second portion with the precursor solution.

2. The method of claim 1, wherein a first portion of the organic thin film is located in the first region, and a second portion of the organic thin film is located in the second region.

3. The method of claim 1, wherein the organic thin film is located in the second region.

4. The method of claim 3, wherein the isomerization generating layer is a photosensitive layer with a reversible isomerization reaction, and the second region has a preset shape; and the adding the precursor solution on the surface of the isomerization generating layer away from the base substrate, and allowing the surface energy of the second region to be greater than the surface energy of the first region, so as to form the organic thin film with the precursor solution comprises:

inkjet printing the precursor solution on a surface of the second region away from the base substrate; and irradiating the second region provided with the precursor solution with light of a preset wavelength range corresponding to the photosensitive layer, so as to allow the surface energy of the second region to be greater than the surface energy of the first region to form the organic thin film having the preset shape with the precursor solution.

5. The method of claim 4, wherein the second region is circular; and the forming the organic thin film having the preset shape comprises:

forming the organic thin film with a curved surface covering the second region, a curvature of the curved surface of the organic thin film being inversely proportional to a diameter of the second region.

6. The method of claim 3, wherein the isomerization generating layer is a photosensitive layer with an irreversible isomerization reaction, and the second region has a preset shape; and the adding the precursor solution on the surface of the isomerization generating layer away from the base substrate, and allowing the surface energy of the second region to be greater than the surface energy of the first region, so as to form the organic thin film with the precursor solution comprises:

irradiating the second region with light of a predetermined wavelength range corresponding to the photosensitive layer, so as to allow the surface energy of the second region to be greater than the surface energy of the first region; and inkjet printing the precursor solution on a surface of the second region irradiated away from the base substrate, so as to form an organic thin film having the preset shape with the precursor solution.

7. The method of claim 6, wherein the second region is circular; and the forming the organic thin film having the preset shape comprises:

forming the organic thin film with a curved surface covering the second region, a curvature of the curved surface of the organic thin film being inversely proportional to a diameter of the second region.

8. An organic thin film comprising:

a base substrate;

an isomerization generating layer formed on the base substrate, the isomerization generating layer comprising a first region and a second region, and the isomerization generating layer is a photosensitive layer with a reversible isomerization reaction; and and organic thin film formed with a precursor solution on a surface of the isomerization generating layer away from the base substrate, surface energy of the second region being greater than surface energy of the first region, and the precursor solution being at least partially located in the second region.

9. A display device comprising the organic thin film of claim 8.

10. An optical device comprising the organic thin film of claim 8.

11. The organic thin film of claim 8, wherein a first portion of the organic thin film is located in the first region, and a second portion of the organic thin film is located in the second region.

12. The organic thin film of claim 8, wherein the organic thin film is located in the second region.

13. The organic thin film of claim 8, wherein the second region is circular; and the preset shape comprises: an organic thin film with a curved surface covering the second region, a curvature of the curved surface of the organic thin film being inversely proportional to a diameter of the second region.

14. A method for preparing an organic thin film, the method comprising:

providing a base substrate;

forming an isomerization generating layer on the base substrate, the isomerization generating layer comprising a first region and a second region; and adding a precursor solution on a surface of the isomerization generating layer away from the base substrate, and allowing surface energy of the second region to be greater than surface energy of the first region, so as to form the organic thin film with the precursor solution, the precursor solution being at least partially located in the second region, wherein the isomerization generating layer is a photosensitive layer with an irreversible isomerization reaction; and the adding the precursor solution on the surface of the isomerization generating layer away from the base substrate, and allowing the surface energy of the second region to be greater than the surface energy of the first region, so as to form the organic thin film with the precursor solution comprises:

irradiating the second region with light of a predetermined wavelength range corresponding to the photosensitive layer, so as to allow the surface energy of the second region to be greater than the surface energy of the first region; and inkjet printing the precursor solution on a surface of the photosensitive layer irradiated away from the base substrate, so as to form the organic thin film aligned from the first portion to the second portion with the precursor solution.

15. The method of claim 14, wherein a first portion of the organic thin film is located in the first region, and a second portion of the organic thin film is located in the second region.

16. The method of claim 14, wherein the organic thin film is located in the second region.

17. The method of claim 16, wherein the isomerization generating layer is a photosensitive layer with a reversible isomerization reaction, and the second region has a preset shape; and
- the adding the precursor solution on the surface of the isomerization generating layer away from the base substrate, and allowing the surface energy of the second region to be greater than the surface energy of the first region, so as to form the organic thin film with the precursor solution comprises:
- inkjet printing the precursor solution on a surface of the second region away from the base substrate; and
- irradiating the second region provided with the precursor solution with light of a preset wavelength range corresponding to the photosensitive layer, so as to allow the surface energy of the second region to be greater than the surface energy of the first region to form the organic thin film having the preset shape with the precursor solution.

18. The method of claim 17, wherein the second region is circular; and
- the forming the organic thin film having the preset shape comprises:
- forming the organic thin film with a curved surface covering the second region, a curvature of the curved surface of the organic thin film being inversely proportional to a diameter of the second region.

19. The method of claim 16, wherein the isomerization generating layer is a photosensitive layer with an irreversible isomerization reaction, and the second region has a preset shape; and
- the adding the precursor solution on the surface of the isomerization generating layer away from the base substrate, and allowing the surface energy of the second region to be greater than the surface energy of the first region, so as to form the organic thin film with the precursor solution comprises:
- irradiating the second region with light of a predetermined wavelength range corresponding to the photosensitive layer, so as to allow the surface energy of the second region to be greater than the surface energy of the first region; and
- inkjet printing the precursor solution on a surface of the second region irradiated away from the base substrate, so as to form an organic thin film having the preset shape with the precursor solution.

* * * * *